United States Patent [19]

Chun et al.

[11] Patent Number: 5,394,108

[45] Date of Patent: Feb. 28, 1995

[54] NON-LINEAR BURST MODE DATA RECEIVER

[75] Inventors: Christopher K. Y. Chun, Mesa; Ray D. Sundstrom, Chandler, both of Ariz.

[73] Assignee: Motorola, Schaumburg, Ill.

[21] Appl. No.: 937,034

[22] Filed: Aug. 31, 1992

[51] Int. Cl.⁶ .............................................. G06G 7/18
[52] U.S. Cl. ................................. 327/335; 327/52; 327/167; 327/103
[58] Field of Search ................. 330/308; 328/149, 127; 307/268, 290, 494, 359, 291, 264; 333/19

[56] References Cited

U.S. PATENT DOCUMENTS

| | | | |
|---|---|---|---|
| 3,581,120 | 5/1971 | Nord | 307/290 |
| 3,816,760 | 6/1974 | Slawson et al. | 307/359 |
| 3,843,208 | 10/1974 | Jones | 328/127 |
| 4,182,963 | 1/1980 | Yamada et al. | 328/127 |
| 4,233,563 | 11/1980 | Schanbacher | 328/149 |
| 4,682,049 | 7/1987 | Kirschner et al. | 307/268 |
| 4,695,750 | 9/1987 | Hara et al. | |
| 4,703,201 | 10/1987 | McGrail | 307/290 |
| 4,733,107 | 3/1988 | O'Shaughnessy et al. | 307/290 |
| 4,754,171 | 6/1988 | Dasai et al. | 307/291 |
| 4,780,623 | 10/1988 | Yagi | 307/351 |
| 4,792,998 | 12/1988 | Toussaint | 330/308 |
| 4,812,687 | 3/1989 | Larson et al. | 307/290 |
| 4,835,486 | 5/1989 | Someruille | 328/127 |
| 5,065,054 | 11/1991 | Nguyen | 307/290 |

OTHER PUBLICATIONS

Steven E. Summer, *Electronic Sensing Controls*, 1969. Pp. 82-84.

*Primary Examiner*—Timothy P. Callahan
*Assistant Examiner*—Terry L. Englund
*Attorney, Agent, or Firm*—Eugene A. Parsons

[57] ABSTRACT

Binary current signals are differentiated to produce pulses indicative of the front and rear edges. The pulses are amplified and utilized in a latch to regenerate binary voltage signals which are amplified replicas of the input signals. Because of the input differentiator the sensitivity of the circuit remains high while the latched output makes the circuit burst mode ready.

13 Claims, 2 Drawing Sheets

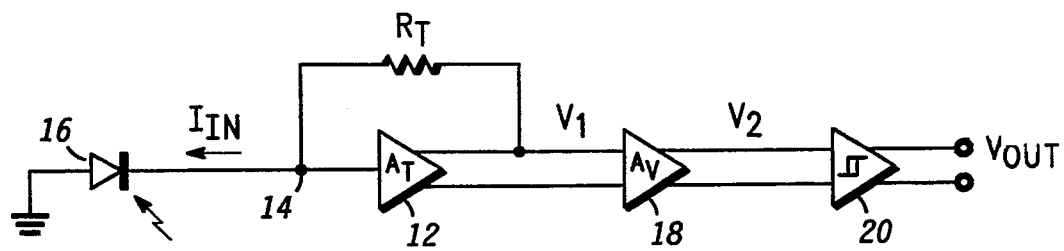
FIG. 1
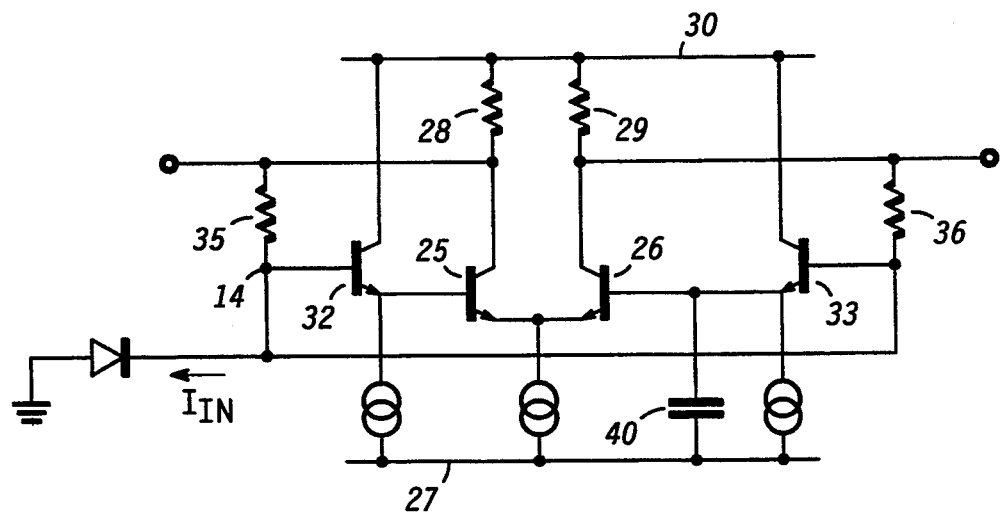
FIG. 2
FIG. 3
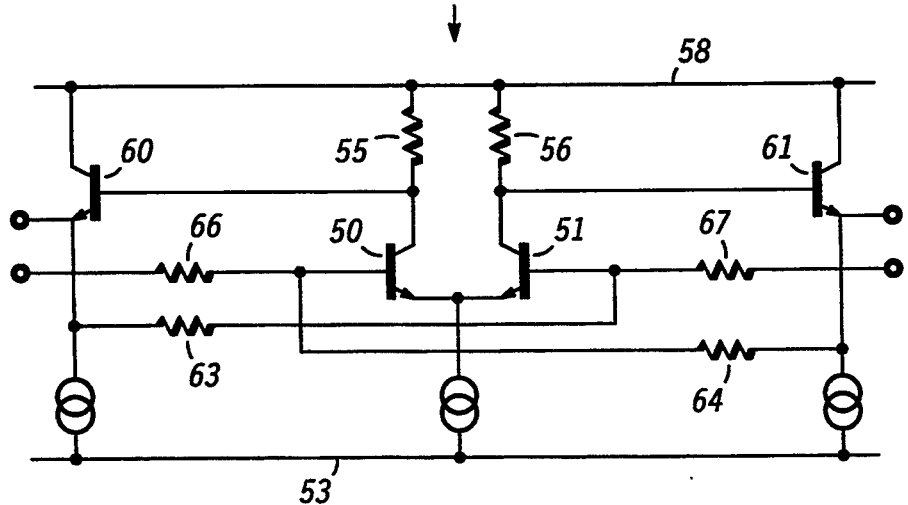

NON-LINEAR BURST MODE DATA RECEIVER

The present invention pertains to data receivers and more particularly to a non-linear burst mode data receiver with improved sensitivity and which is ready for logic signals in the quiescent state.

BACKGROUND OF THE INVENTION

Typical transimpedance amplifiers convert current input signals into a voltage signal through a linear process. The output is basically the input signal only amplified and changed from a current to a voltage. For very fast signals, this transimpedance amplifier needs to have a large bandwidth to follow the input signal. With traditional designs, it is very difficult to get large bandwidth without careful layout and design of the circuit, which greatly increases the time and cost of manufacture.

Conventional transimpedance amplifiers use AC-coupled circuits. These AC-coupled circuits can only be used for continuous data streams due to the time associated with charging the coupling capacitors. In most applications where the amplifier must be burst mode ready, the data stream must either be preceded by an identifying string of binary signals, to give the amplifier time to conform, and/or the amplifier must include sophisticated DC bias restore circuitry. Either of these solutions increase the cost and complexity of operation.

Further, the sensitivity of prior art transimpedance amplifiers was generally adversely effected by input loading. The sensitivity of a transimpedance amplifier can be defined as the minimum input which will produce no errors in the output. Generally, the sensitivity is a strong function of parasitic capacitance and inductance at the input stage or stages. Thus, in the prior art AC-coupled transimpedance amplifiers, virtually anything done at the front end, such as edge triggering, would tend to reduce or adversely impact sensitivity.

SUMMARY OF THE INVENTION

It is a purpose of the present invention to provide a burst mode data receiver which is at a logic level in the quiescent state and ready for a logic input, and which is simple to manufacture while maintaining improved sensitivity and burst mode operation.

It is a further purpose of the present invention to provide a burst mode data receiver which tolerates much higher input capacitances without unduly effecting the sensitivity or dynamic range.

It is a further purpose of the present invention to provide a non-linear burst mode data receiver with true DC operation, a low quiescent current and a large input current dynamic range.

The above problems and others are at least partially solved and the above purposes and others are realized in a non-linear burst mode data receiver including an input stage having an input terminal for receiving non-linear input signals and an output terminal supplying output signals indicative of the front and rear edges of non-linear input signals received, an amplifier coupled to receive the output signals from the input stage and provide amplified output signals at an output terminal thereof, and a hysteresis stage coupled to receive the amplified output signals from the output terminal of the amplifier and regenerate an amplified replica of the non-linear input signals.

The above problems and others are at least partially solved and the above purposes and others are further realized in a method of providing non-linear transimpedance amplifying comprising the steps of receiving a non-linear input signal, differentiating the non-linear input signal to produce signals indicative of front and rear edges of the received non-linear signal, amplifying the indicative signals, and utilizing the amplified indicative signals to regenerate an amplified replica of the received non-linear signal.

BRIEF DESCRIPTION OF THE DRAWINGS

Referring to the drawings:

FIG. 1 is a schematic/block diagram of a burst mode data receiver embodying the present invention;

FIG. 2 is a schematic diagram of a portion of FIG. 1;

FIG. 3 is a schematic diagram of another portion of FIG. 1; and

DESCRIPTION OF THE PREFERRED EMBODIMENT

Figure 4:
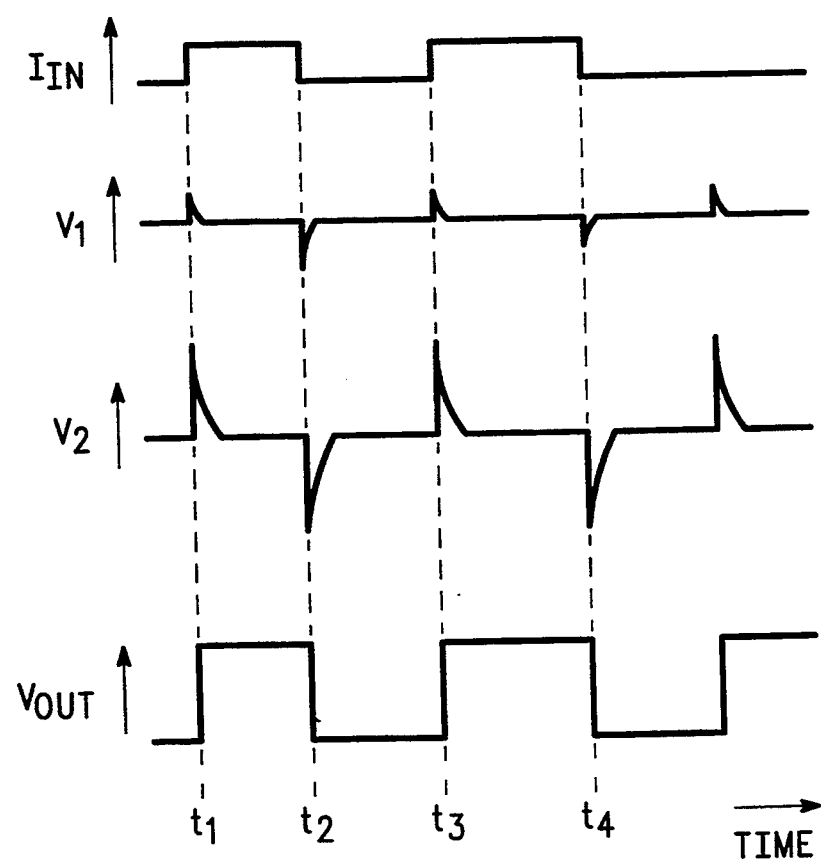
FIG. 4 illustrates the time/amplitude relationship of several waveforms available at different points in FIG. 1.

Referring specifically to FIG. 1, a schematic/block diagram of a burst mode data receiver 10 embodying the present invention is illustrated. The specific embodiment illustrated is integrated onto a single semiconductor chip, however, it will be understood that discrete components could be utilized if desired. Burst mode data receiver 10 includes an input stage 12, which in this embodiment is a transimpedance amplifier, having an input terminal 14 constructed to receive non-linear input signals. In this example, input terminal 14 has a photo diode 16 connected thereto, which diode 16 supplies binary signals to input terminal 14 in response to light impinging thereon. Burst mode data receiver 10 further includes an amplifier 18 and a hysteresis stage 20. Input stage 12, amplifier 18 and hysteresis stage 20 are all direct coupled with no coupling capacitors required because, as will be more apparent presently, DC inputs have no effect on amplifier 10. Signals supplied at input terminal 14 are current signals and output signals from hysteresis stage 20 are amplified voltage replicas of the input current signals.

FIG. 2 illustrates a schematic diagram of a typical input stage 12. Input stage 12 includes a first pair of transistors 25 and 26 connected to provide a differential common emitter stage. The common connected emitters of transistors 25 and 26 are connected through a constant current source to a reference potential 27 and the collectors are connected through separate load resistors 28 and 29, respectively, to a power source 30. The collectors of transistors 25 and 26 also provide output signals to amplifier 18. The base of transistor 25 is connected to the emitter of a transistor 32, which emitter is also connected through a constant current source to the reference potential 27. The collector of transistor 32 is connected directly to power source 30 and the base is connected to input terminal 14. The base of transistor 26 is connected to the emitter of a transistor 33, which emitter is also connected through a constant current source to the reference potential 27. The collector of transistor 33 is connected directly to power source 30 and the base is connected to input terminal 14. The bases of transistors 32 and 33 are also separately connected through feedback resistors 35 and 36 to the collectors of transistors 25 and 26, respectively. A small capacitor 40 is connected between the base of transistor 26 and ground.

Capacitor 40 is included to couple the base of transistor 26 to reference 27 and reduce the speed of operation thereof. It will be recognized by those skilled in the art that capacitance 40 could be connected to the emitter of transistor 25, or other components could be utilized at these or other points in the circuit to provide similar results. By slowing the operation of transistor 26, input currents produce a switching action in circuit 12 between transistors 25 and 26, which essentially differentiates the input signal. The differentiating action of stage 12 results in output pulses being produced at the collectors of transistors 25 and 26. In this specific embodiment a positive pulse is produced as a result of the positive going front or leading edge of the input current signals and a negative pulse is produced as a result of the negative going back or trailing edge of the input current signals. It will of course be understood by those skilled in the art that the described pulses are simply for purposes of explanation and that a variety of signals indicating the front and back edges of the input signals can be derived.

The output pulses from input stage 12 are applied to amplifier 18 which in this specific embodiment is a differential amplifier. By utilizing a differential amplifier as amplifier 18, the common mode properties of signals applied thereto are removed and a true differential signal is produced. Amplifier 18 is illustrated, for convenience of explanation, as a separate stage in this embodiment, but it should be recognized that it could actually be incorporated into one or both of input stage 12 and hysteresis stage 20. Also, amplifier 18 can include as many separate amplifying stages as are required for the specific application. Because the output signals of amplifier 18 are generated from the front and back edges of the input signals, pulse width distortion is virtually eliminated.

This method and apparatus for producing non-pulse width distorted output signals has the additional advantage of being able to track input signals from less than one microampere to greater than one milliampere, which is a dynamic range of greater than a factor of three ($10^3$). Further, the bandwidth of input stage 12 is not critical, linearity is not needed and very slow signals can be tracked, as will be explained in more detail presently.

Referring specifically to FIG. 3, one embodiment of hysteresis stage 20 is illustrated. In this embodiment hysteresis stage 20 includes a pair of transistors 50 and 51 connected into a differential amplifier configuration with common connected emitters connected through a constant current source to a reference potential 53. The collectors of transistors 50 and 51 are connected through individual load resistors 55 and 56, respectively, to a power source 58. The collector of transistor 50 is also connected directly to the base of a transistor 60, the collector of which is connected directly to power source 58 and the emitter of which is connected through a constant current source to reference potential 53 and through a resistor 63 to the base of transistor 51. The collector of transistor 51 is also connected directly to the base of a transistor 61, the collector of which is connected directly to power source 58 and the emitter of which is connected through a constant current source to reference potential 53 and through a resistor 64 to the base of transistor 50. Amplified pulses from the output of amplifier 18 are supplied through a resistor 66 to the base of transistor 50 and through a resistor 67 to the base of transistor 51. Output terminals for hysteresis stage 20 are connected to the emitters of transistors 60 and 61, respectively.

In this embodiment of hysteresis stage 20, the resistances of resistors 66 and 67 are equal and the resistances of resistors 63 and 64 are equal. Resistors 63 and 64 provide a positive feedback from the output to the base of each transistor 50 and 51 which latches the circuit in one or the other of two output states or logic levels. Resistors 63 and 64 also establish an offset voltage which must be exceeded by input signals before switching between the two output states or logic levels occurs. The values of resistors 63 and 64 and resistors 66 and 67 can be changed in various applications to change the offset voltage to suit the application. Because of the latching function of hysteresis stage 20, the output is always latched in one of the possible output states, even when there is no input signal. Thus, it is not necessary to include complicated circuitry for detecting the center point of input signals and centering the output signals around the input signals or providing an input offset voltage or current signal.

Hysteresis stage 20 provides a number of advantages to burst mode data receiver 10 including the advantage of having a latched output with no input signal. Further, hysteresis stage 20 provides output signals with faster rise and fall times because once hysteresis stage 20 is triggered the output switches states, with the switching time depending only upon the components of hysteresis stage 20. Also, the offset is generally set to be well above noise and other interference signals in the system so that only true data signals will trigger hysteresis stage 20. As previously mentioned, because of the novel hysteresis stage 20 linearity in the previous stages is not a requirement. A clock may be easily incorporated into burst mode data receiver 10, and, especially hysteresis stage 20, to provide clocked output signals, if desired.

Referring to FIG. 4, the time/amplitude relationship of several waveforms available at different points in FIG. 1 is represented. Specifically, the input current from photo diode 16 is illustrated in the first line. The second line represents typical pulses produced by input stage 12 while the third line represents the pulses amplified by amplifier 18. The fourth line represents the regenerated, amplified replicas of the non-linear input signals from line one. Because the output is always latched in one of the logic levels, burst mode data receiver 10 is burst mode ready, that is it is always ready for correct operation on the first bit of data received at input 14. Further, because the output is always latched in one of the logic levels, no sophisticated DC bias restore circuits are required and DC coupling is possible.

While burst mode data receiver 10 has been described as a transimpedance data amplifier which converts a current input to an amplified voltage output, it should be understood that it could be utilized to amplify voltage input signals instead of current input signals. Some modifications to input stage 12 may be required, as for example, resistors 35 and 36 may be removed.

Thus, a new and improved burst mode data receiver has been disclosed which is simpler to manufacture while maintaining improved sensitivity and burst mode operation. Further, the burst mode data receiver tolerates much higher input capacitances without unduly effecting the sensitivity or dynamic range. Also, the linearity requirements of the burst mode data receiver are greatly relaxed (i.e. bandwidth does not need to be large) and it further incorporates true DC operation, a low quiescent current and a large input current dynamic range. Because of the novel construction clocked outputs can be easily incorporated and the entire burst mode data receiver can be easily integrated on a single semiconductor chip.

While we have shown and described specific embodiments of the present invention, further modifications and improvements will occur to those skilled in the art. We desire it to be understood, therefore, that this invention is not limited to the particular forms shown and we intend in the append claims to cover all modifications that do not depart from the spirit and scope of this invention.

What is claimed is:

1. A non-linear burst mode data receiver comprising:
   an input stage having an input terminal for receiving a non-linear input signal having front and rear edges and an output terminal supplying a pair of output pulses indicative of the front and rear edges of the received non-linear input signal, the input stage including a differentiating circuit connected to receive the non-linear input signal and to differentiate rising and falling edges to provide the pair of output pulses;
   an amplifier coupled to receive the output pulses from the input stage and provide amplified output pulses at an output terminal thereof; and
   a hysteresis stage coupled to receive the amplified output pulses from the output terminal of the amplifier and regenerate an amplified replica of the non-linear input signals.

2. A non-linear burst mode data receiver comprising:
   an input stage having an input terminal for receiving non-linear input signals and an output terminal supplying output signals indicative of the front and rear edges of non-linear input signals received, wherein the input stage includes a differential amplifier with first and second transistors connected to form a differential common emitter stage and a capacitor is connected to one of the first and second transistors to slow the operation of the one of the first and second transistors;
   an amplifier coupled to receive the output signals from the input stage and provide amplified output signals at an output terminal thereof; and
   a hysteresis stage coupled to receive the amplified output signals from the output terminal of the amplifier and regenerate an amplified replica of the non-linear input signals.

3. A non-linear burst mode data receiver as claimed in claim 2 wherein the one of the first and second transistors includes a base and the capacitor is connected to the base.

4. A non-linear burst mode data receiver as claimed in claim 1 wherein the non-linear input signals the input stage is designed to receive are binary signals.

5. A non-linear burst mode data receiver as claimed in claim 1 wherein the hysteresis stage includes a Schmitt trigger type of circuit.

6. A non-linear burst mode data receiver as claimed in claim 1 wherein the hysteresis stage includes a pair of transistors connected into a differential amplifier stage with each of the transistors being connected to receive positive feedback at an input thereof to provide a latching action.

7. A non-linear burst mode data receiver as claimed in claim 1 wherein the amplifier includes a differential amplifier that removes common mode properties of signals applied thereto.

8. A non-linear burst mode data receiver as claimed in claim 1 wherein the amplifier is integrated onto a single semiconductor chip.

9. A non-linear burst mode data receiver comprising:
   a differentiating stage having an input terminal for receiving binary signals each having front and rear edges and an output terminal supplying output pulses indicative of the front and rear edges of the binary input signals received; and
   a latching stage coupled to receive the output pulses from the output terminal of the differentiating stage and regenerate an amplified replica of the received binary signals.

10. A non-linear burst mode data receiver as claimed in claim 9 wherein the differentiating stage is designed to receive binary current signals and the latching stage is designed to provide voltage binary signals.

11. A non-linear burst mode data receiver comprising:
    a differentiating stage having an input terminal for receiving a binary signal having front and rear edges and an output terminal supplying output pulses indicative of the front and rear edges of the binary signal received;
    an amplifier coupled to receive the output pulses from the differentiating stage and provide amplified output pulses at an output terminal thereof; and
    a latching stage coupled to receive the amplified output pulses from the output terminal of the amplifier and regenerate an amplified replica of the received binary signal.

12. A non-linear burst mode data receiver comprising:
    a differentiating stage having an input terminal for receiving a binary signal and an output terminal supplying output pulses indicative of the front and rear edges of binary signals received, the differentiating stage including a differential amplifier with first and second transistors connected to form a common emitter stage and a capacitor connected to the second transistor to slow the operation of the second transistor to produce a differentiating action;
    an amplifier coupled to receive the output pulses from the differentiating stage and provide amplified output pulses at an output terminal thereof; and
    a hysteresis stage coupled to receive the amplified output pulses from the output terminal of the amplifier and including a pair of transistors connected into a differential amplifier stage with each of the transistors being connected to receive positive feedback at an input thereof to provide a latching action to regenerate an amplified replica of the received binary signal.

13. A method of providing non-linear transimpedance amplifying comprising the steps of:
    receiving a non-linear input signal having front and rear edges;
    differentiating the non-linear input signal to produce pulses indicative of the front and rear edges of the received non-linear signal;
    amplifying the indicative pulses; and
    utilizing the amplified indicative pulses to regenerate an amplified replica of the received non-linear signal.

* * * * *